(12) United States Patent
Park

(10) Patent No.: US 7,888,602 B2
(45) Date of Patent: Feb. 15, 2011

(54) PRINTED CIRCUIT BOARD HAVING AIR VENT FOR MOLDING AND PACKAGE USING THE SAME

(75) Inventor: Sung-Yong Park, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 104 days.

(21) Appl. No.: 12/120,622

(22) Filed: May 14, 2008

(65) Prior Publication Data
US 2008/0298029 A1    Dec. 4, 2008

(30) Foreign Application Priority Data
Jun. 1, 2007    (KR) .................. 10-2007-0053953

(51) Int. Cl.
*H05K 1/00*    (2006.01)

(52) U.S. Cl. .............. 174/252; 257/684; 257/712; 257/713; 361/690; 361/692

(58) Field of Classification Search ......... 257/712–722, 257/522, 713, 684; 361/678, 679.49, 692, 361/831, 690; 174/252
See application file for complete search history.

(56) References Cited

U.S. PATENT DOCUMENTS

| | | | | |
|---|---|---|---|---|
| 5,285,352 A | * | 2/1994 | Pastore et al. ............... | 361/707 |
| 5,485,037 A | * | 1/1996 | Marrs ......................... | 257/712 |
| 5,602,720 A | * | 2/1997 | Natsuhara et al. ............ | 361/708 |
| 5,905,633 A | * | 5/1999 | Shim et al. .................. | 361/704 |
| 5,981,890 A | * | 11/1999 | Chen .......................... | 200/515 |
| 6,084,297 A | * | 7/2000 | Brooks et al. ............... | 257/698 |
| 6,919,630 B2 | * | 7/2005 | Hsiao ......................... | 257/706 |
| 7,000,684 B2 | * | 2/2006 | Kenny et al. ................ | 165/80.4 |
| 7,061,104 B2 | * | 6/2006 | Kenny et al. ................ | 257/714 |
| 7,224,047 B2 | * | 5/2007 | Carberry et al. ............. | 257/676 |

FOREIGN PATENT DOCUMENTS

| | | |
|---|---|---|
| JP | 2002-050719 | 2/2002 |
| JP | 2004-096022 | 3/2004 |
| JP | 2006-165311 | 6/2006 |
| KR | 2002-0053657 | 7/2002 |
| KR | 2005-0089364 | 9/2005 |

OTHER PUBLICATIONS

English language abstract of Korean Publication No. 2002-0053657.
English language abstract of Japanese Publication No. 2002-050719.
English language abstract of Japanese Publication No. 2004-096022.

\* cited by examiner

*Primary Examiner*—Cathy Lam
(74) *Attorney, Agent, or Firm*—Muir Patent Consulting, PLLC

(57) ABSTRACT

Provided is a printed circuit board having air vents and a semiconductor package that uses the printed circuit board having the air vents. The printed circuit board includes a substrate layer having a circuit pattern and a protection layer formed on the substrate layer, a molding region on which at least one semiconductor chip is mounted and for which a molding for the semiconductor chip is performed, and a plurality of air vents extending towards edges of the printed circuit board from the molding region.

18 Claims, 4 Drawing Sheets

PRINTED CIRCUIT BOARD HAVING AIR VENT FOR MOLDING AND PACKAGE USING THE SAME

CROSS-REFERENCE TO RELATED PATENT APPLICATION

This application claims priority under 35 USC §119 to Korean Patent Application No. 10-2007-0053953, filed on Jun. 1, 2007 in the Korean Intellectual Property Office, the disclosure of which is incorporated herein in its entirety by reference.

BACKGROUND

1. Technical Field

The present invention relates to a semiconductor device, and more particularly, to a printed circuit board in which a semiconductor chip is molded and a package using the printed circuit board.

2. Description of the Related Art

Generally, a semiconductor package is manufactured through a sawing process, a die attaching process, a wire bonding process, and a molding process. The molding process is a process of sealing a semiconductor chip using a molding resin to protect the electrical characteristics of the semiconductor chip and to mechanically protect the semiconductor chip.

The molding is performed using a mold that determines the shape of a package. The main body of the mold is formed by filling a molding compound (resin) in a molding cavity that is formed with upper, middle, and lower plates.

In the molding process, a molding region of a printed circuit board is molded by filling a resin in the molding cavity by supplying the resin through a mold gate after the molding region of the printed circuit board, which includes a semiconductor chip for which a die attach process and a wire bonding process are completed, is located in the molding cavity of the mold. At this point, at the same time that the resin is supplied to the molding cavity through the mold gate of the mold, air present in the molding cavity is vented to the outside through an air vent included on the mold.

When annealing the mold so as to harden the resin, the air vent can be misaligned on the printed circuit board due to the thermal expansion coefficient difference between the printed circuit board and the mold. In a package on package (POP) device, a ball land, which is a connection terminal, is present on the upper side of a lower package that is combined with an upper package. However, when molding is performed, if the air vent is misaligned, a path of the air vent can pass over the ball land or, if the resin is pushed out through the air vent, the ball land can be contaminated by the resin. FIG. 1 is a photo image of a printed circuit board in which a ball land is contaminated by a resin. In FIG. 1, it can be seen that a molding resin 15 passes directly over the circular ball land 20 on a printed circuit board 10. As such, if the ball land 20 becomes contaminated by the molding resin 15, a contact failure between a contact terminal of the upper package and the ball land 20 can occur.

Also, when the mold separates from the printed circuit board after an annealing process of the resin is finished, a photo sensitive resist (PSR), which is a protective layer for the printed circuit board, can be detached due to the air vent. As a result, the detached PSR can block the air vent, and thus, air in the molding cavity cannot be vented to the outside in a subsequent process, thereby causing an unstable molding process.

SUMMARY

To solve the above and/or other problems, the present invention provides a printed circuit board that can reduce the contamination of a ball land of the printed circuit board and a mold during the molding of the printed circuit board, and a package using the printed circuit board.

According to an aspect of the present invention, there is provided a printed circuit board that comprises a substrate layer having a circuit pattern and a protection layer formed on the substrate layer, the printed circuit board comprising; a molding region on which at least one semiconductor chip is mounted and for which a molding for the semiconductor chip is performed; and a plurality of air vents extending towards edges of the printed circuit board from the molding region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
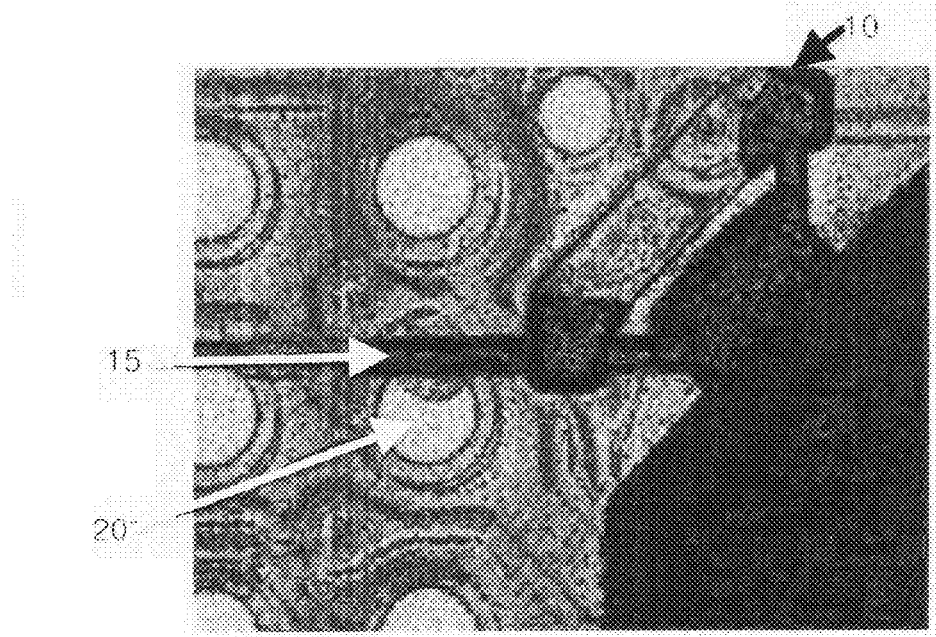
FIG. 1 is a photo image of a printed circuit board in which a ball land is contaminated by a molding resin.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 2:
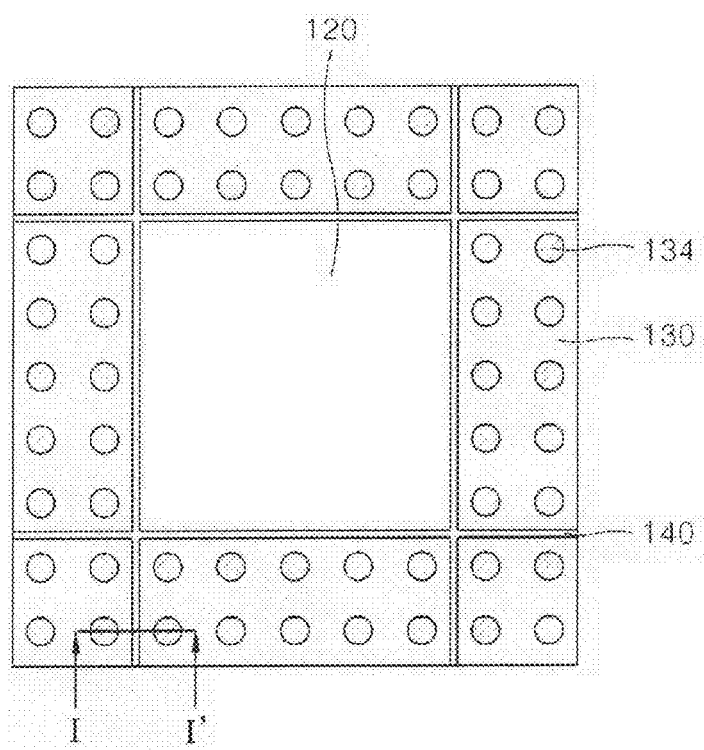
FIG. 2 is a plan view of a printed circuit board according to an embodiment of the present invention.

FIG. 2 is a plan view of a printed circuit board 100 (not shown) according to an embodiment of the present invention. Referring to FIG. 2, a molding region 120, where a semiconductor chip (not shown) is mounted and molding is performed, is formed in the center of the printed circuit board 100. In other words, the molding region 120 is configured to receive at least one semiconductor chip and an encapsulant covering the at least one semiconductor chip. A connection terminal region 130, on which connection terminals 134 are formed, is formed around the molding region 120 to electrically connect the printed circuit board 100 with another printed circuit board 100 that is stacked in a package on package (POP) device. The connection terminals 134, for example, can be a ball land. An air vent 140 is extended along an edge of the printed circuit board 100 from the molding region 120 passing through the connection terminal region 130. The air vent 140 is a path for venting air from the molding region 120 when the semiconductor chip is molded using a mold.

FIGS. 3A through 3D are cross-sectional views taken along line I-I' of the connection terminal region 130 of the printed circuit board 100 of FIG. 2, according to some embodiments of the present invention. Referring to FIGS. 3A through 3D, in a printed circuit board 100a, a substrate layer 102 includes an internal circuit pattern 104, the connection terminals 134 exposed by a protection layer 106, such as a PSR layer, are formed on the substrate layer 102, and the air vents 140a, 140b, 140c, 140d are formed in a groove shape in the protection layer 106 between the connection terminals 134. The protection layer 106 is also formed on a lower side of the substrate layer 102, which is formed of a ceramic or a flexible resin.

Figure 3A:
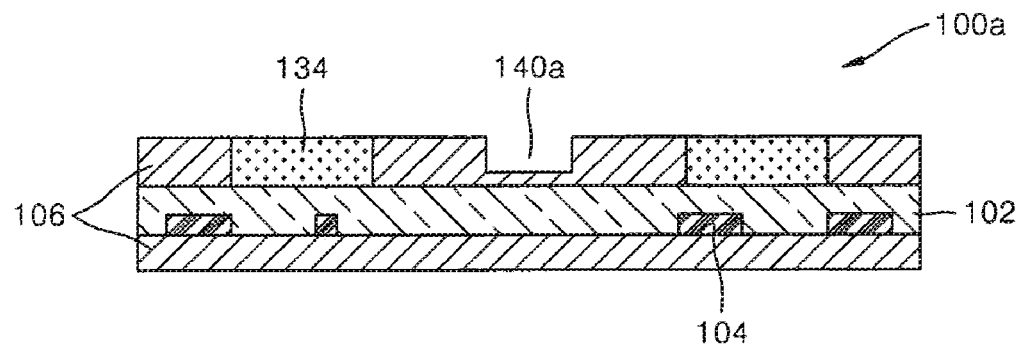
FIGS. 3A through 3D are cross-sectional views taken along line I-I' of a connection terminal region of the printed circuit board of FIG. 2, according to some embodiments of the present invention.

In the printed circuit board 100a of FIG. 3A, an air vent 140a is formed within the protection layer 106. Thus, the bottom of the air vent 140a does not expose the substrate layer 102 under the protection layer 106. In other words, the protection layer 106 is the bottom of the air vent 140a.

Figure 3B:
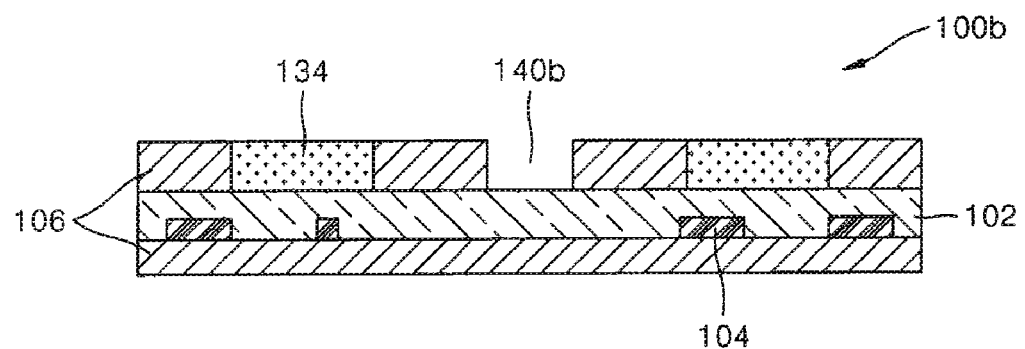

In a printed circuit board 100b of FIG. 3B, according to another embodiment, the bottom of the air vent 140b exposes the substrate layer 102.

Figure 3C:
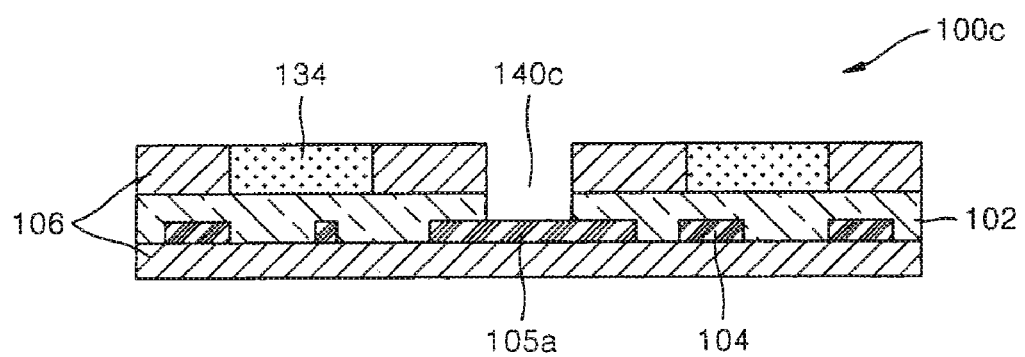

In a printed circuit board 100c of FIG. 3C, the bottom of an air vent 140c exposes a dummy pattern 105a formed on the substrate layer 102. The dummy pattern 105a can be formed of the same material, for example Cu, as the circuit pattern 104. The dummy pattern 105a, which does not constitute a part of a circuit, can make a smooth air flow in the air vent 140c during molding due to the surface properties of metal. Also, the dummy pattern 105a can be formed of a material different from that of the circuit pattern 104.

Figure 3D:
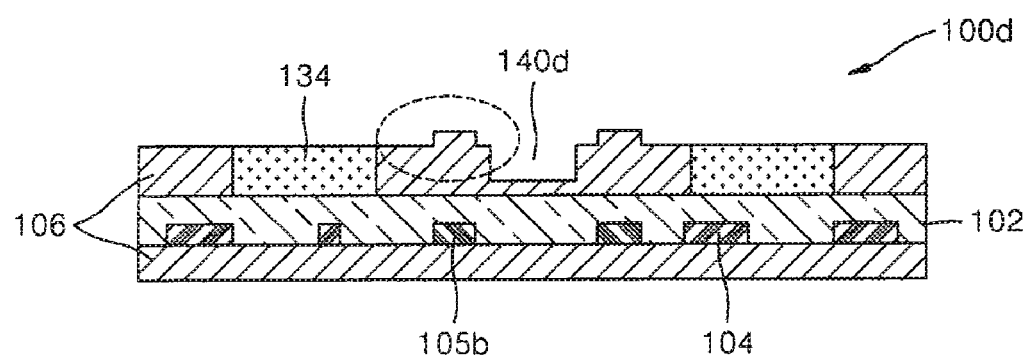

In a printed circuit board 100d of FIG. 3D, steps are formed on both sidewalls of an air vent 140d. Due to the steps, a wide upper space of the air vent 140d can be maintained. The steps can be caused by the dummy pattern 105b that is formed on the substrate layer 102.

Referring to FIGS. 3A through 3D, in the printed circuit boards 100a, 100b, 100c and 100d, the protection layer 106 is formed on both upper and lower sides of the substrate layer 102. However, the printed circuit board 100 can have different stack structures from the stack structures as described above. Also, the printed circuit boards 100a, 100b, 100c and 100d, of FIGS. 3A through 3D can further include a lower connection terminal (not shown) that is used for a lower package of a POP device that is to be connected to another substrate by other means than the connection terminal 134 mounted on the upper surface of the lower package.

In the printed circuit boards 100a, 100b, 100c and 100d, of FIGS. 3A through 3D, a semiconductor chip is molded into a lower package, and an upper package is electrically connected to a connection terminal of the lower package, and thus, a POP device is formed. As described above, the connection terminal of the lower package, which is connected to the upper package, is not contaminated by the molding resin, and thus, the possibility of a contact failure can be minimized, and thereby the reliability of the POP device can be increased.

FIGS. 4A through 4D are cross-sectional views illustrating a process of molding a semiconductor chip on a printed circuit board 100 having an air vent 140, according to an embodiment of the present invention. In the present embodiment, an upper gate mold structure that includes an upper plate, a middle plate 200, and a lower plate will now be described. However, the present embodiment is not limited to the upper gate mold structure, as various other mold structures can be applied.

Figure 4A:
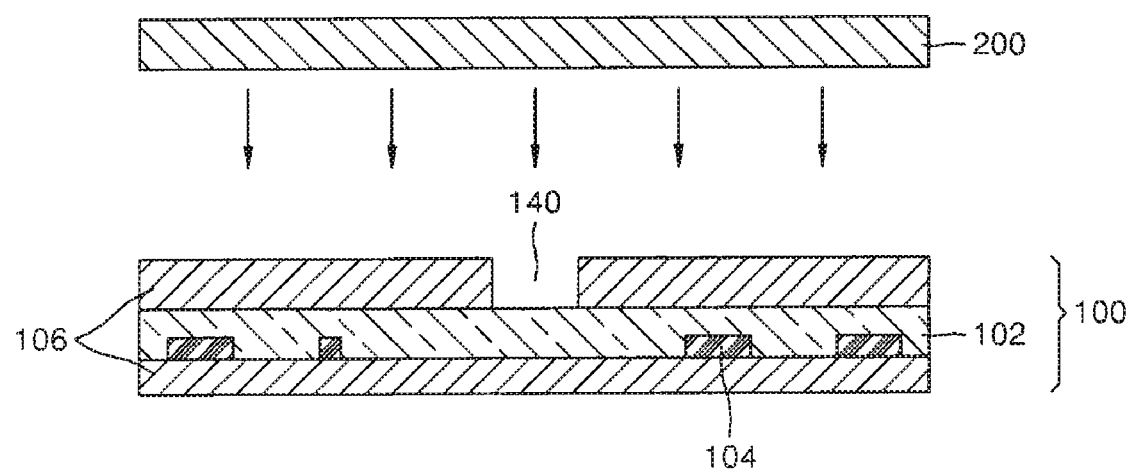
FIGS. 4A through 4D are cross-sectional views illustrating a process of molding a semiconductor chip on a printed circuit board having an air vent, according to an embodiment of the present invention.

Referring to FIG. 4A, the middle plate 200 of the upper gate mold structure is moved from above the printed circuit board 100 onto the printed circuit board 100 so as to be combined with the printed circuit board 100. As shown in FIG. 4A, the air vent 140 is formed in the printed circuit board 100, not in the middle plate 200. The upper and lower plates that form a molding cavity (not shown) by combining with the middle plate 200 are not shown.

Figure 4B:
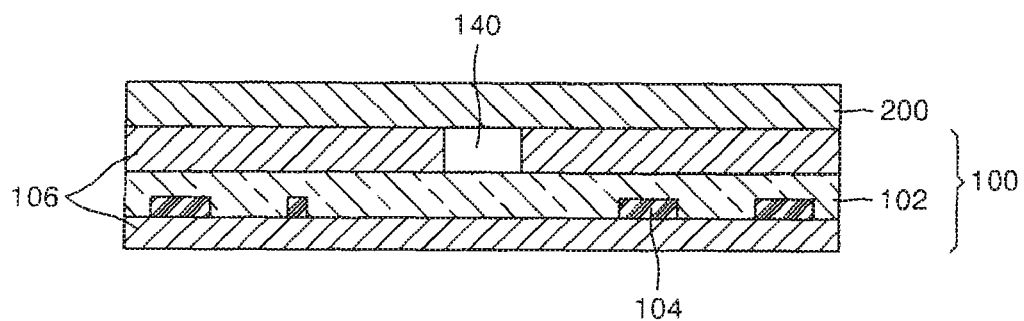

Referring to FIG. 4B, an air path through which air in the molding cavity can be vented when a molding resin is injected into the molding cavity is formed when an upper part of the air vent 140 is closed by combining the middle plate 200 with the printed circuit board 100.

Figure 4C:
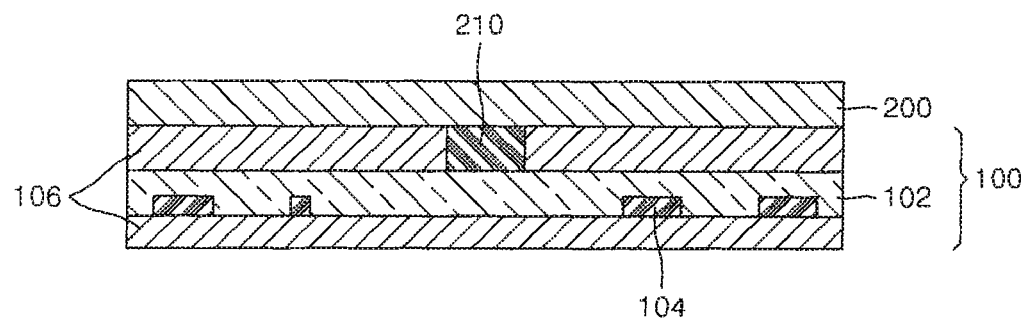

FIG. 4C shows that the molding resin 210 that is injected into the molding cavity protrudes through the air vent 140 after the air in the molding cavity is vented. The molding resin 210 that is injected into the molding cavity can protrude to a portion adjacent to the molding cavity of the air vent 140.

As depicted in FIG. 1, in the conventional art, if the air vent is formed in the middle plate, due to the different thermal expansion coefficient between the printed circuit board and the middle plate, the air vent can pass over the connection terminal without being aligned between the connection terminals of the printed circuit board in a molding process that includes an annealing process. At this point, the molding resin protruding from the air vent may be placed on the connection terminals, that is, the connection terminals may become contaminated, and such contamination of the connection terminals with the molding resin may cause poor electrical contact between the connection terminals and external terminals in a subsequent process. However, in the present embodiment, the air vent 140 is formed in the printed circuit board 100, and thus, the air vent 140 is not misaligned due to the thermal expansion difference, thereby preventing the connection terminals 134 from being contaminated by the molding resin.

Figure 4D:
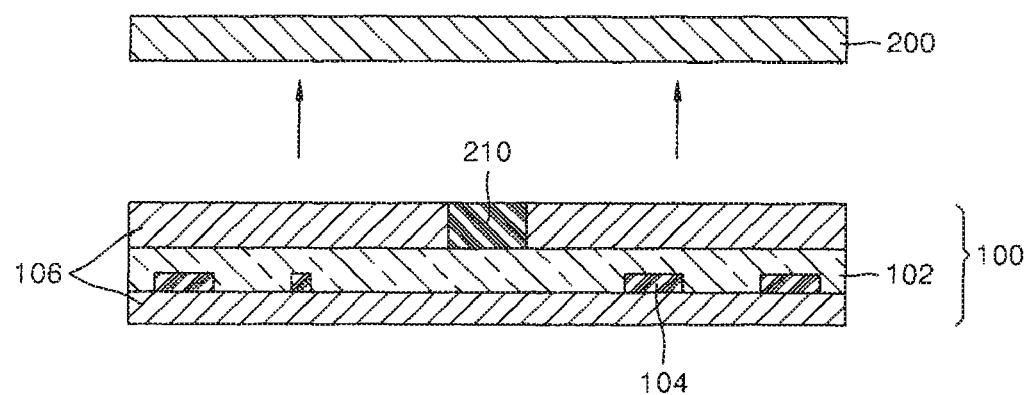

Referring to FIG. 4D, after the injection of molding resin into the molding cavity is completed, the middle plate 200 is separated from the printed circuit board 100. At this point, since the air vent 140 is not formed in the middle plate 200, the molding resin 210 and the protection layer 106 of the printed circuit board 100 are not inserted into the air vent of the middle plate 200, and thus, the air vent 140 is not contaminated.

According to the present invention, an air vent through which air in a molding cavity is vented during molding a semiconductor package is formed in a printed circuit board. Thus, connection terminals of the printed circuit board are not contaminated by a molding resin when the air vent is misaligned due to the thermal expansion coefficient difference between the printed circuit board and the mold. Accordingly, the occurrence of contact failures when packages are stacked is minimized, and thereby, the reliability of the printed circuit board is increased. As opposed to the case when the air vent is formed in the mold, a molding failure in a subsequent process due to blocking of the air vent by being inserted into a protection layer of the printed circuit board or the molding resin remaining in the air vent is prevented according to embodiments of the invention.

According to an aspect of the present invention, there is provided a printed circuit board that comprises a substrate layer having a circuit pattern and a protection layer formed on the substrate layer, the printed circuit board comprising: a molding region on which at least one semiconductor chip is mounted and for which a molding for the semiconductor chip is performed; and a plurality of air vents extending towards edges of the printed circuit board from the molding region.

The printed circuit board may further comprise a first connection terminal region that comprises a plurality of first connection terminals which is formed around the molding region.

The printed circuit board may further comprise a second connection terminal region that comprises a plurality of second connection terminals formed on a surface opposite to the surface where the molding region and the air vents are formed.

The air vents may be formed within the protection layer or the air vents may expose the substrate layer under the protection layer.

The printed circuit board may further comprise a first dummy pattern that is formed along the air vents and which is exposed by the air vents. The first dummy pattern may be formed of the same material as that of the circuit pattern.

Each of the air vents may have a lower region that comprises the bottom of the air vent and an upper region having a width greater than that of the lower region.

The printed circuit board may further comprise a pair of second dummy patterns on both sides of the air vent in the substrate layer, wherein the upper region of the air vent is formed by a step difference formed due to the protection layer that covers the pair of second dummy patterns.

The substrate layer may be formed of a ceramic or a flexible resin.

At least one semiconductor chip that is to be molded may be mounted on the molding region.

According to another aspect of the present invention, there is provided a semiconductor package comprising: a printed circuit board that comprises a first molding region on which at least one semiconductor chip is mounted and on which a molding for the semiconductor chip is to be performed, a first connection terminal region around the first molding region, and a plurality of air vents extending towards edges of the printed circuit board from the first molding region passing through the first connection terminal region; and at least one first semiconductor chip that is mounted and molded in the first molding region of the printed circuit board.

The semiconductor package may further comprise a second connection terminal region on a surface opposite to the surface where the first molding is formed.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A printed circuit board that comprises a substrate layer having a circuit pattern and a protection layer formed on the substrate layer, the printed circuit board comprising:
    a molding region, the molding region configured to receive at least one semiconductor chip and an encapsulant covering the at least one semiconductor chip;
    a plurality of air vents extending to edges of the printed circuit board from the molding region; and
    at least one dummy pattern disposed along the air vents.

2. The printed circuit board of claim 1, further comprising a first connection terminal region disposed around the molding region, the first connection terminal region comprising a plurality of first connection terminals.

3. The printed circuit board of claim 2, wherein:
    the molding region and the first connection terminal region are on a first surface of the substrate layer; and
    the printed circuit board further comprises a second connection terminal region disposed on a surface opposite to the surface where the molding region and the air vents are disposed, the second connection terminal region comprising a plurality of second connection terminals.

4. The printed circuit board of claim 1, wherein the air vents expose the substrate layer under the protection layer.

5. The printed circuit board of claim 1, wherein the at least one dummy pattern includes a first dummy pattern disposed along the air vents, and which is exposed by the air vents.

6. The printed circuit board of claim 5, wherein the first dummy pattern comprises substantially the same material as that of the circuit pattern.

7. The printed circuit board of claim 1, wherein each of the air vents has a lower region that comprises the bottom of the air vent and an upper region having a width greater than that of the lower region.

8. The printed circuit board of claim 7, wherein the at least one dummy pattern includes a pair of second dummy patterns on both sides of the air vent in the substrate layer, wherein the upper region of the air vent is formed by a step difference disposed in the protection layer that covers the pair of second dummy patterns.

9. The printed circuit board of claim 1, wherein the substrate layer comprises a ceramic or a flexible resin.

10. The printed circuit board of claim 1, wherein at least one semiconductor chip is mounted on the molding region.

11. A printed circuit board, comprising:
    a substrate layer including a circuit pattern;
    a first protection layer disposed on an upper surface of the substrate layer and defining an air vent;
    a second protection layer disposed on a lower surface of the substrate layer;
    a plurality of connection terminals disposed in the first protection layer of the printed circuit board; and
    at least one dummy pattern disposed in the substrate layer.

12. The printed circuit board of claim 11, wherein the at least one dummy pattern is disposed on an upper surface of the second protection layer.

13. The printed circuit board of claim 12, wherein the at least one dummy pattern is disposed below the air vent and wherein the air vent exposes the at least one dummy pattern.

14. The printed circuit board of claim 12, further comprising a pair of steps extending above the first protection layer at sides of the air vent.

15. The printed circuit board of claim 14, wherein the at least one dummy pattern comprises a pair of dummy patterns disposed in the substrate layer and below the steps.

16. The printed circuit board of claim 12, wherein the at least one dummy pattern comprises substantially the same material as the circuit pattern.

17. The printed circuit board of claim 11, wherein the air vent substantially surrounds a molding region of the printed circuit board.

18. The printed circuit board of claim 11, wherein the air vent extends to at least one edge of the printed circuit board.

* * * * *